United States Patent [19]

Hsu et al.

[11] Patent Number: 5,376,578
[45] Date of Patent: Dec. 27, 1994

[54] METHOD OF FABRICATING A SEMICONDUCTOR DEVICE WITH RAISED DIFFUSIONS AND ISOLATION

[75] Inventors: Louis L. Hsu, Fishkill; Seiki Ogura; Joseph F. Shepard, both of Hopewell Junction, all of N.Y.

[73] Assignee: International Business Machines Corporation, Armonk, N.Y.

[21] Appl. No.: 169,874

[22] Filed: Dec. 17, 1993

[51] Int. Cl.[5] .............................................. H01L 21/70
[52] U.S. Cl. .......................................... 437/56; 437/40; 437/913
[58] Field of Search .................. 437/56, 40, 41, 913, 437/61, 62, 67; 148/DIG. 50

[56] References Cited

U.S. PATENT DOCUMENTS

| | | | |
|---|---|---|---|
| 4,849,369 | 7/1989 | Jeuch et al. | 437/40 |
| 4,851,365 | 7/1989 | Jeuch | 437/40 |
| 4,948,745 | 8/1990 | Pfiester et al. | 437/56 |
| 5,015,594 | 5/1991 | Chu et al. | 437/57 |
| 5,120,571 | 6/1992 | Gill et al. | 437/41 |
| 5,270,234 | 12/1993 | Huang et al. | 437/44 |
| 5,286,667 | 2/1994 | Lin et al. | 437/913 |
| 5,298,443 | 3/1994 | Jang | 437/913 |

*Primary Examiner*—Brian E. Hearn
*Assistant Examiner*—Michael Trinh

[57] ABSTRACT

A method of forming a MOS FET in which the source, drain, and isolation are all raised above the surface of the single crystal silicon includes the steps of depositing a blanket gate stack including the gate oxide and a set of gate layers, and then depositing isolation members in apertures etched in the gate stack using the gate oxide as an etch stop. The sidewalls that are used to form an LDD source and drain separate a gate contact from source and drain contacts.

19 Claims, 7 Drawing Sheets

METHOD OF FABRICATING A SEMICONDUCTOR DEVICE WITH RAISED DIFFUSIONS AND ISOLATION

TECHNICAL FIELD

The field of the invention is that of CMOS integrated circuit processing.

BACKGROUND ART

In the field of integrated circuit processing, it is essential to isolate one transistor from a neighboring transistor or other component. The art currently uses a trench isolation in which a trench is etched into the electrically active silicon and filled with oxide, or LOCOS isolation in which thermal oxide is grown downwardly into the silicon. Variations on these schemes are well known in the art, all commonly having the factor that there is an insulator, usually $SiO_2$, of a thickness sufficient to prevent voltage on an interconnection line above the insulator from inverting the silicon beneath the insulator and thereby creating a parasitic channel; and that all or part of the isolation is recessed to provide for smaller step height for the interconnection. Throughout the years, the art has tended to smooth topographical features in the isolation while maintaining protection against parasitic channel formation.

Before the introduction of LOCOS, when design rules were above 5 $\mu$m, a blanket oxide was grown over the wafer before any of the elements of the transistors were fabricated. Apertures were etched into the blanket insulation to hold the transistors. In this case, topographical features were severe, which caused significant reduction in yield as design ground rules became smaller and the step to be traversed by interconnects became sharper. One distinguishing feature of this old prior art work compared with more recent prior art work was that there was a direct line between adjacent transistors along the surface of the single crystal silicon. Since the minimum distance between transistors was on the order of 5 $\mu$m, there was considerable resistance on this path that is not present in modern submicron technology.

A number of problems have also become apparent in the case of trench isolations, which are preferred to the old blanket approach because of their planar surfaces and because of the elimination of the "bird's beak" associated with LOCOS isolations, thereby permitting a shorter, smaller transverse dimension than LOCOS isolations. The approaches in the art have attempted to reduce step size by recessing the insulator into the single crystal area, with the result that there was an increased risk of creating defects in the single crystal material in the process of forming the isolation. The art has long sought a method of isolation in which the smallest transverse distance can be obtained without compromising the effectiveness of the isolation.

SUMMARY OF THE INVENTION

A method of forming an integrated circuit from a set of transistors, the sources, drains, and isolations of which are all raised above the surface of the single crystal silicon and includes the steps of depositing a blanket gate stack including the gate oxide and a set of gate layers, cutting through the gate stack to form isolation apertures that are filled with oxide, and depositing source and drain connections in apertures etched in the gate stack using the gate oxide as an etch stop. Sidewalls in the source and drain apertures provide the LDD source and drain. A layer of dielectric is deposited and/or grown over the source and drain contacts. A self-aligned gate contact is formed by selectively removing through the dielectric and nitride on the gate stack or an aligned contact is formed, leaving nitride sidewalls to isolate the gate contact from the source and drain connections.

BEST MODE OF CARRYING OUT THE INVENTION

Figure 1:
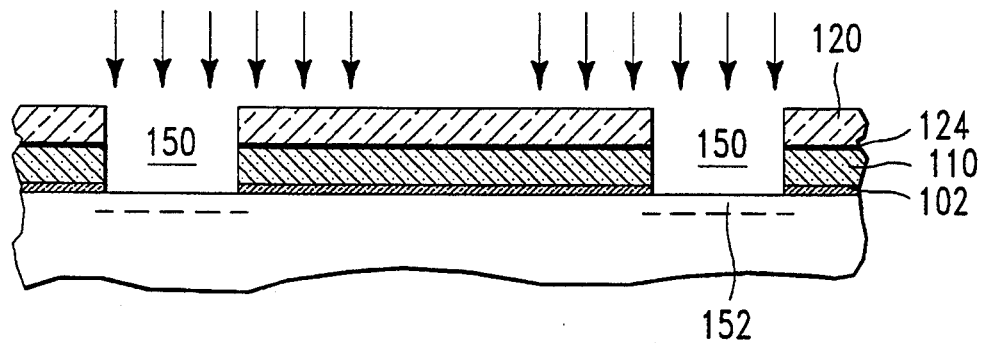
FIGS. 1 through 6 show in cross-section a transistor constructed according to the invention.

Referring now to FIG. 1, there is shown in cross-section a portion of a silicon integrated circuit formed in single crystal substrate 100 having a surface 50. The epitaxial layer 10 of the single crystal silicon has been previously prepared by forming N-wells and/or P-wells and with the use of blanket threshold implants as is conventional in the art. These preliminary steps will be referred to as preparing the epitaxial layer. The surface has been planarized in a conventional chemical-mechanical process and a set of three layers has been formed across the wafer. The set of layers is referred to as the gate stack, and denoted by the numerals 102, 110 and 120, in which layer 102 is the gate oxide ($\leq 100$Å $SiO_2$, formed by conventional dry thermal oxidation) of the final transistor gates that will be used, layer 110 is a layer of about 150-200 nm of polycrystalline silicon (poly) doped N+, and layer 120 is a layer of about 100nm of nitride ($Si_3N_4$) that protects layer 110. Poly layer 110 and subsequent poly layers are doped by ion implantation after being put down. These implants are not heated in a diffusion step until after a poly gate contact has been made and both the bit line and the word line are in place. An intervening layer 124, shown as a thick line, is a layer of oxide of 50-100 Å formed for use as an etch stop when the nitride is removed. Apertures 150 have been opened in the gate stack in areas that will be the field isolation. An optional field implant may be performed at this time. A typical field implant (152) for a P− doped substrate might be about $5 \times 10^{17}/cm^3$ (boron).

Figure 2:
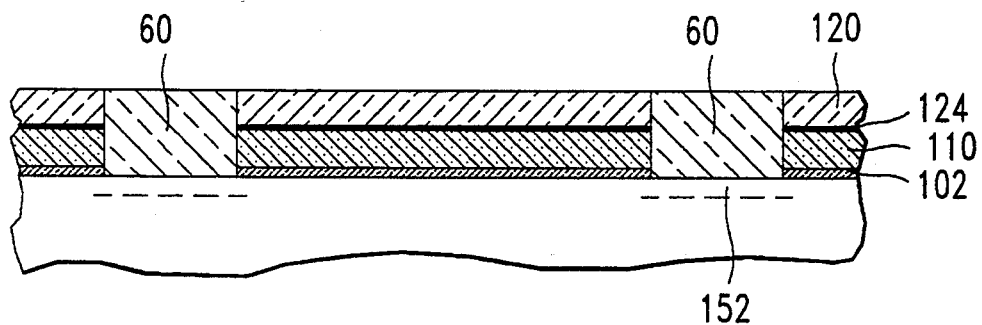

Referring now to FIG. 2, there are shown two isolation members of oxide 60 which have been deposited in a conventional low pressure CVD oxide process, e.g. TEOS. A conventional etching process such as reactive ion etching (RIE) was used to cut apertures for isolation members 60 down through nitride 120 and poly 110, stopping on oxide 102. If oxide 102 is removed during the process of opening the apertures, a thin oxide layer may be grown to provide a stable surface under oxide 60. This layer will be comparable in thickness to the gate oxide, so that the isolation oxide does not penetrate below the gate oxide as it did in the prior art. After deposition, oxide isolation members 60 have been chemical-mechanically polished in a conventional fashion as illustrated in U.S. Pat. No. 5,015,594, so that there is a planar surface, referred to as the isolation surface, in which the oxide 60 is coplanar with the top of nitride 120. Isolation 60 extends in front of and behind the plane of the cross section to isolate the cell. It is evident in this figure that this method of isolation provides a planar reference at the top of the gate area (in the center of the drawing), so that contacts from the gate or the source or drain may extend smoothly over the isolation without any steps. The portion of the gate stack that remains covers the entire active device area which will contain a gate electrode, a source, and a drain.

Figure 3:
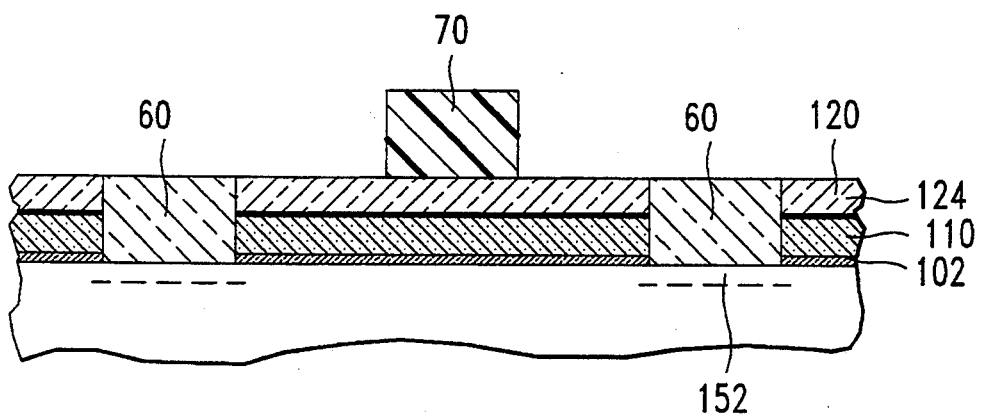

Referring now to FIG. 3, there is shown the next step before cutting source and drain apertures 155 through the gate stack using the same RIE process as used to cut apertures for oxide 60. Photoresist 70 defines what will be the gate. After the etch step, oxide 102 at the bottom of the apertures has been stripped by a selective oxide etch, e.g. buffered HF solution (BHF). At this time, a light implant, the first dose of an LDD (Lightly Doped Drain) may be performed. A typical implant is $\sim 5 \times 10^{14}/cm^2$ of arsenic or phosphorous for an N-channel device.

Figure 4:
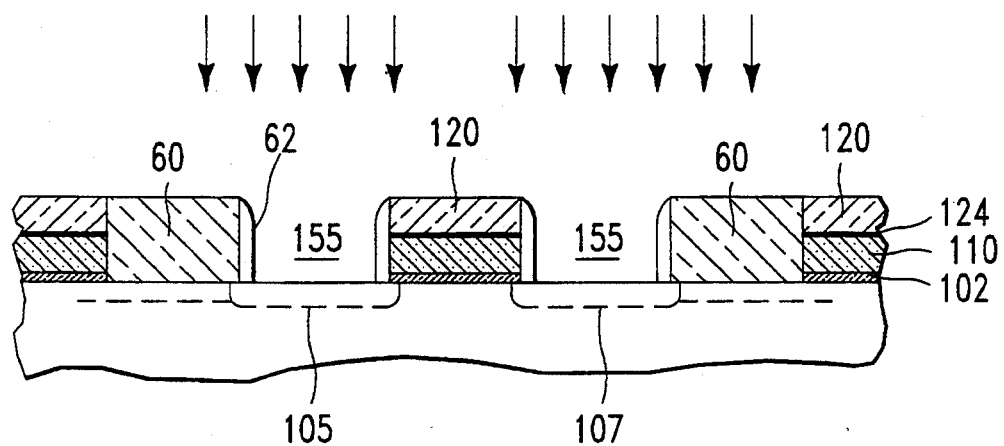

Referring now to FIG. 4, the area is shown after the light implant has been made and a set of conformal sidewalls denoted collectively with the numerals 62 has been formed on the sides of all the apertures. These sidewalls are illustratively, a first layer ($\approx 100Å$) of thermal oxide followed by a layer ($\approx 400Å$) of nitride or CVD oxide. Sidewalls 62 isolate the gate stack from the strap connection that will be formed and also serves as the implant mask for the second source/drain implant. Next, a heavier source/drain implant is made, for example $3-5 \times 10^{15}/cm^2$ of As at 50–80 KeV in which sidewalls 62 protect the LDD portion of the transistor from the heavier dose so that the more heavily doped areas forming the sources and drains have been formed without affecting the previous light dose.

Figure 5:
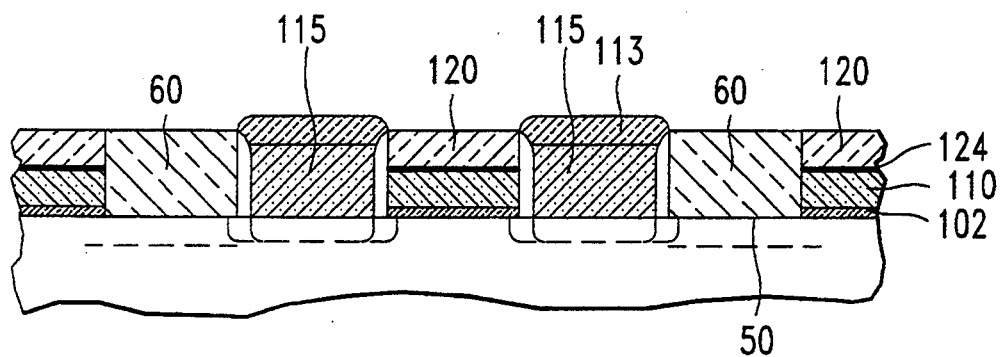

In FIG. 5, a layer of polysilicon (doped in-situ) has been deposited in the apertures and polished back using nitride layer 120 as a polish stop. The portion of this poly layer in the former aperture 155 is a contact from source 152 that will be connected to an interconnection line in a later step as a connector 115. The high degree of planarity is evident, as the poly contact 115 is coplanar with oxide 60. An optional insulating layer (oxide) 113 has been grown to protect poly contacts 115 while nitride 120 is removed.

Figure 6:
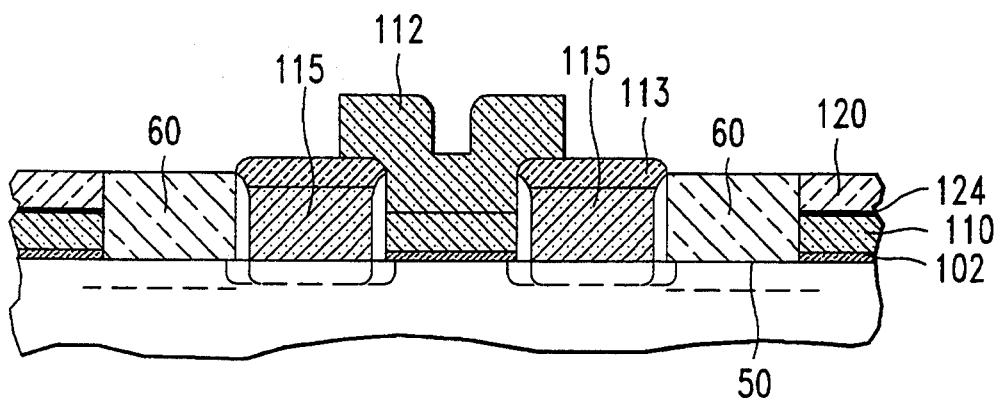

In FIG. 6, nitride 120 has been etched to expose gate 110 and provide for a gate contact 112. A typical etchant is hot phosphoric acid. Layer 124 is then removed with BHF. Additional layers will be formed on top of layer 112 to establish the lines connected to contact 115 and other interconnections (the "back end" processes), as is conventional. Those skilled in the art will readily appreciate that the process illustrated here can readily be applied in many circuits such as DRAMS, CPUs, SRAMS, video rams, application specific integrated circuits, and the like.

An advantageous feature of the invention is that isolation 60 is formed above the surface of the silicon, surface 50. Referring for convenience to FIG. 6, it can be seen that there is a straight path along a surface 50 between the single crystal substrate and the bottom of oxide 60 between the electrode on one transistor and a corresponding electrode on the other side of isolation 60. In the prior art of submicron critical dimension, a straight line on the surface was not tolerated and a shallow trench was typically cut to provide an insulator thickness great enough to prevent a channel from being induced by voltage applied to conductive lines passing above. Also, when the trench was cut down below the surface, any conductive path due to the finite conductivity of the material had to travel an irregular line of greater length. In LOCOS isolation, the thermal isolation oxide also grows down into the single-crystal substrate. In operation, one capacitor may be charged up to the nominal voltage of the device (5 volts or so) while the other is at ground providing a potential path for a "punch-through" leakage path to form through the short distance between them. In the case of the example illustrated, the groundrule is a nominal 0.25 micron, so that the potential for leakage is evident.

Figure 12A:
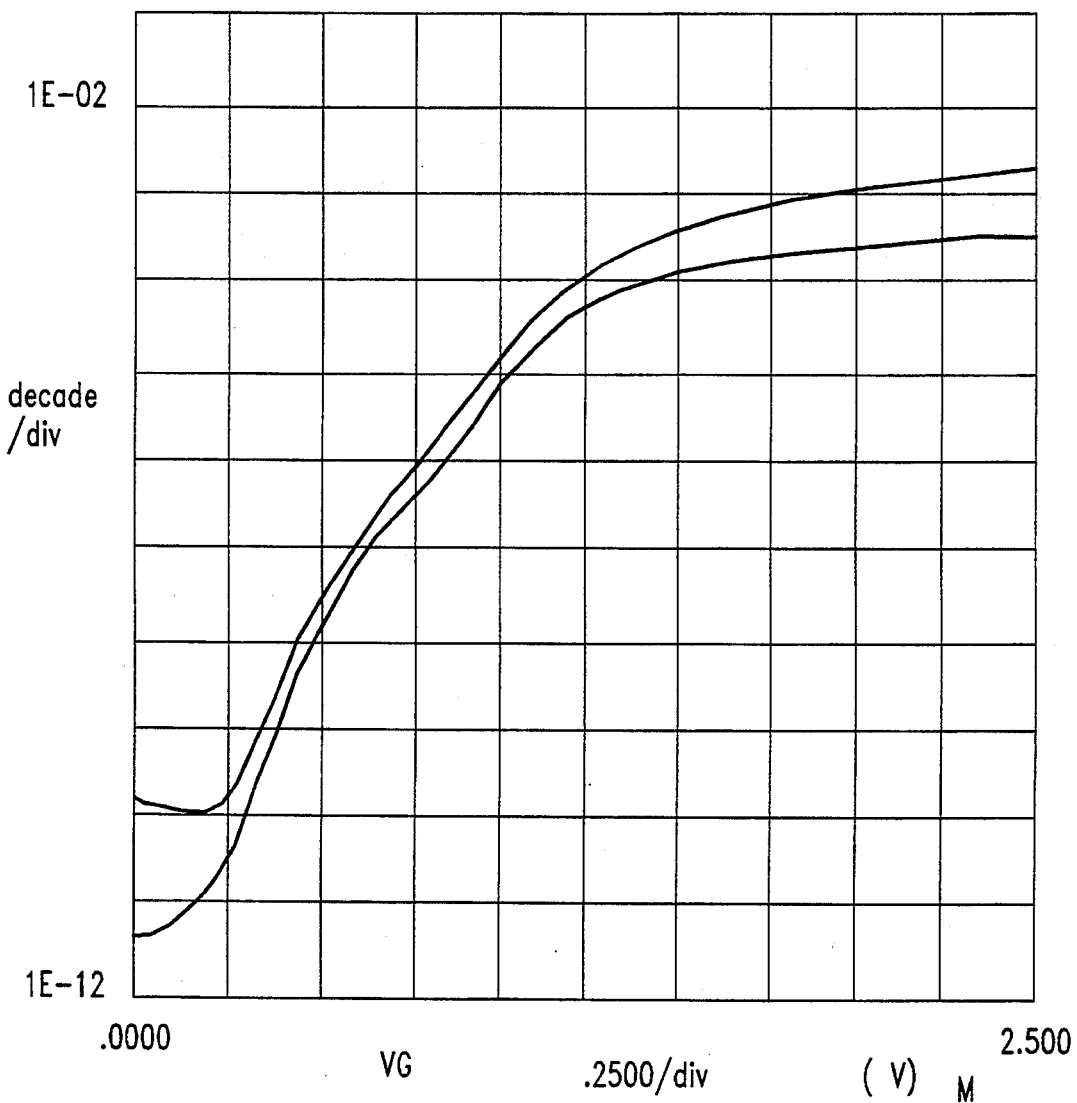
FIGS. 12A and 12B illustrate I-V curves from a prior art transistor and from a transistor constructed according to the invention.
Figure 12B:
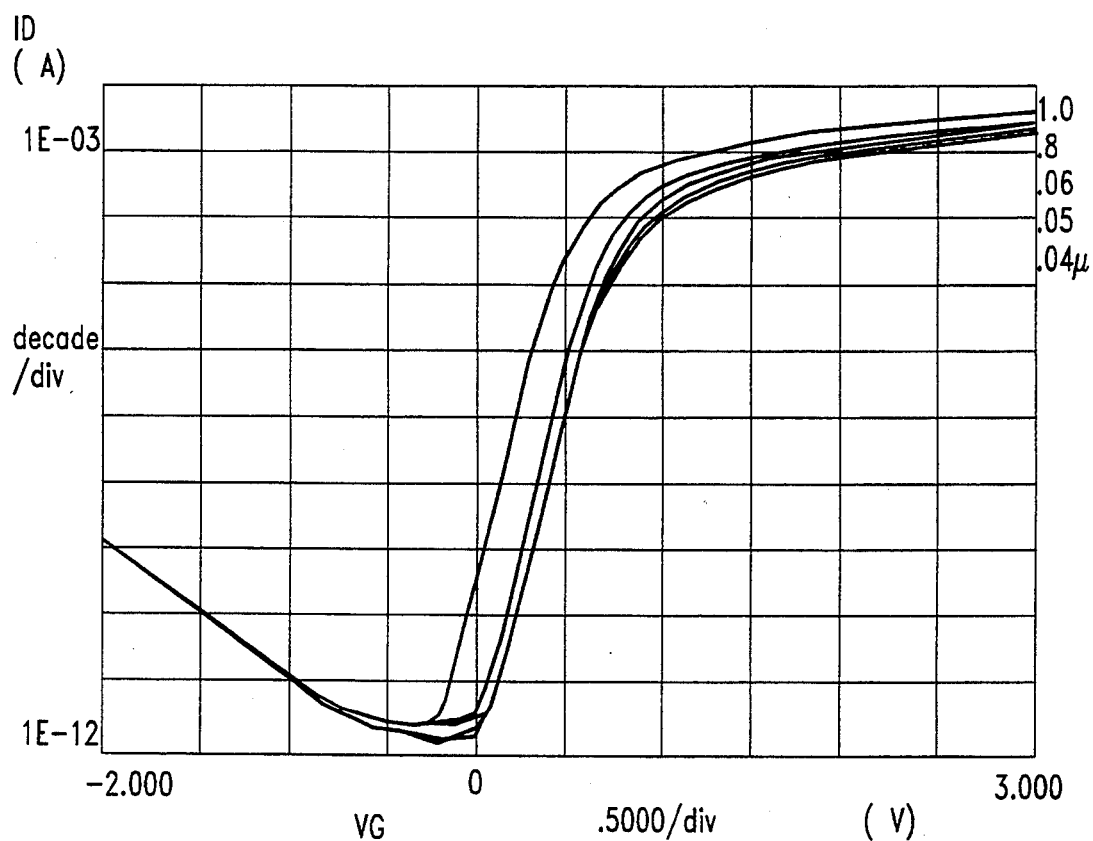

Another advantage of the invention is illustrated in FIGS. 12A and 12B. FIG. 12A illustrates an I-V curve from a conventional transistor isolated with a shallow trench isolation. A shoulder is evident that results from the existence of a parasitic transistor on the edge of the trench. As the gate voltage is increased, the portion of the gate at the edge of the transistor causes the parasitic to turn on, so that there is a greater slope in the voltage range for which the parasitic is turning on. This is a disadvantage because there is an early "turn-on" of the device, i.e. it turns on at a lower gate voltage than is specified. Additionally, there is a gate oxide reliability exposure since it is observed that the gate oxide is thinner as it wraps around the corner of a shallow trench. This is one of several contributing causes of parasitic devices. The other causes are field intensification at the corner and high interface charge in the vertical sidewall insulator which is difficult to overcome since field implants strike the flat bottom of the trench in much greater concentration than the sides.

In contrast, FIG. 12B illustrates a corresponding I-V curve for a transistor constructed according to the invention, showing a smooth curve with no shoulder.

Figure 7:
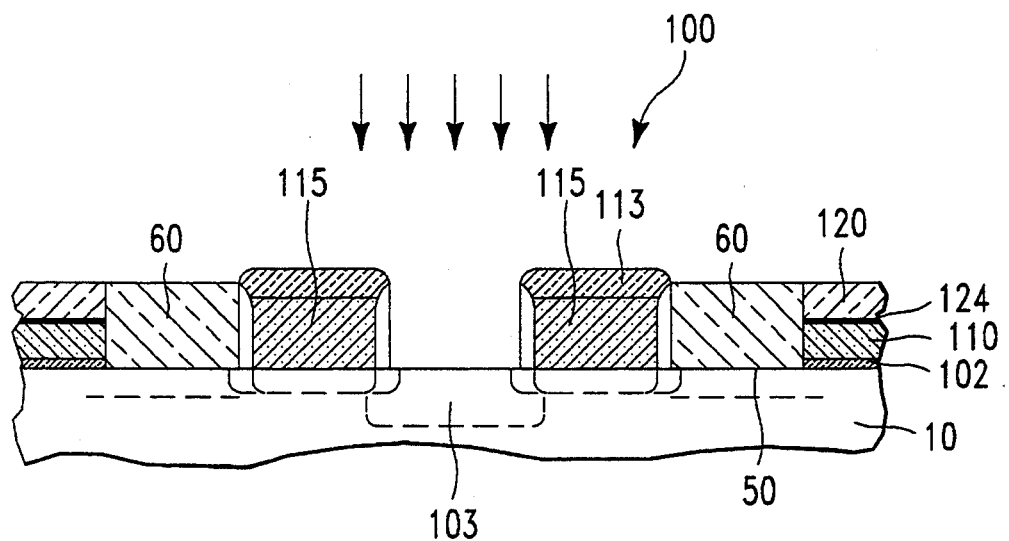
FIGS. 7 and 8 show steps in a first alternative method.
Figure 8:
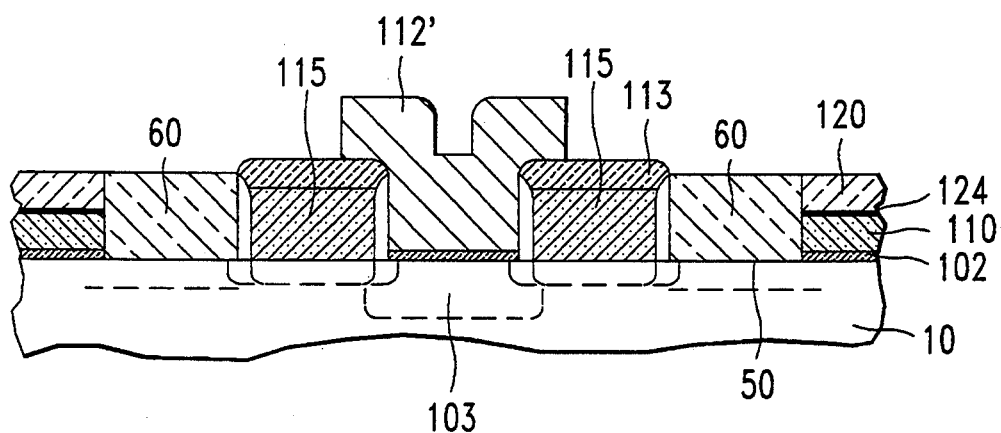

An alternative process is illustrated in FIGS. 7 and 8 showing that, after the step in FIG. 5, the whole gate stack (layers 120 and 110) may be removed and a channel implant of $\approx 2 \times 10^{12}/cm^2$ (boron) for short channel effects in an N-channel transistor may be made. After the implant, a substitute gate poly 112' is deposited.

Figure 9:
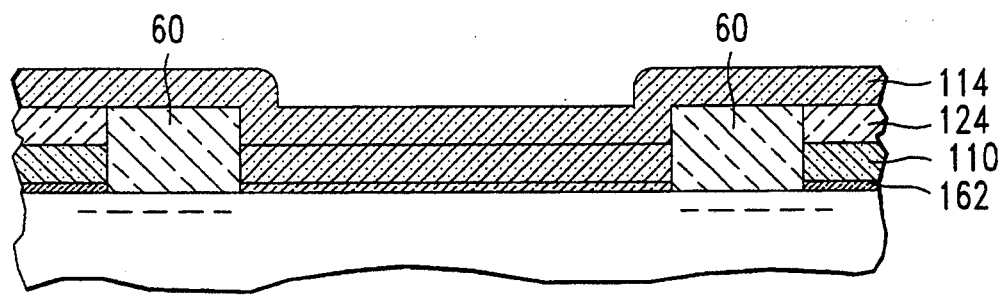
FIGS. 9-11 show steps in a second alternative method.
Figure 10:
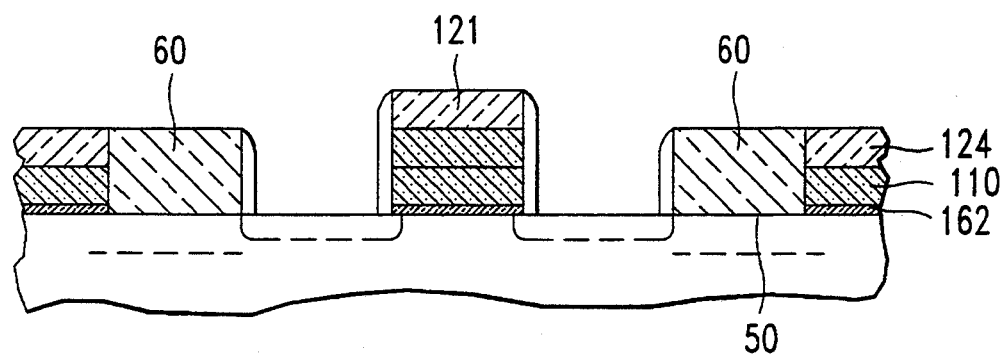
Figure 11:
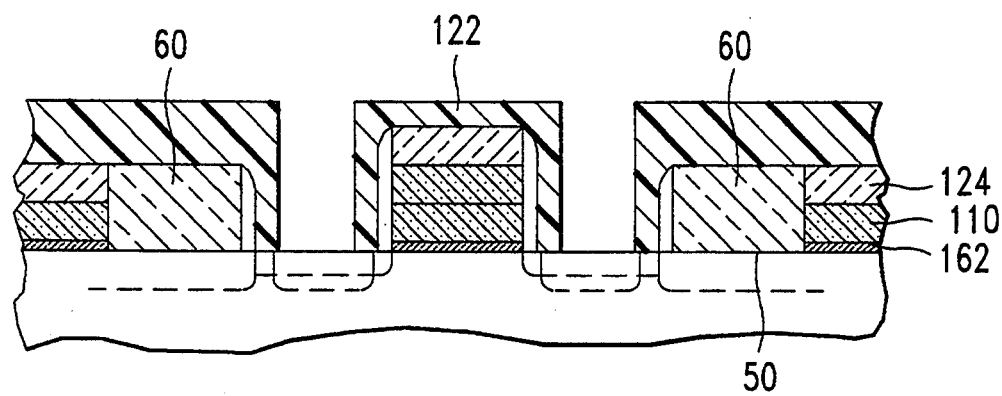

Another alternative is illustrated in FIGS. 9–11, in which nitride 120 is removed before the source/drain apertures 55 are cut and replaced with a second poly layer 114. A new nitride layer 121 is patterned in FIG. 10 to define the gate and the source/drain apertures, implants and sidewalls are done as before. In FIG. 11, a conformal layer of phospho-silicate glass (PSG) 122 has been put down to isolate the poly source/drain contacts that will be put down from the gate. An aperture will be opened through the PSG and nitride to form a gate contact behind the plane of the paper.

Additionally, the use of poly layers in the gate stack that are implanted after deposition and the deferring of heat treatment to diffuse the implants and activate the source and drain until just before the word line is deposited avoids a problem in the prior art in which heat treatment of doped poly increased the grain size which, in turn, permitted subsequent oxide etch steps to penetrate along grain boundaries and damage underlying layers. In this process, the poly is not exposed to an oxide etch after the heat treatment, so the possibility of penetration does not arise.

Figure 13A:
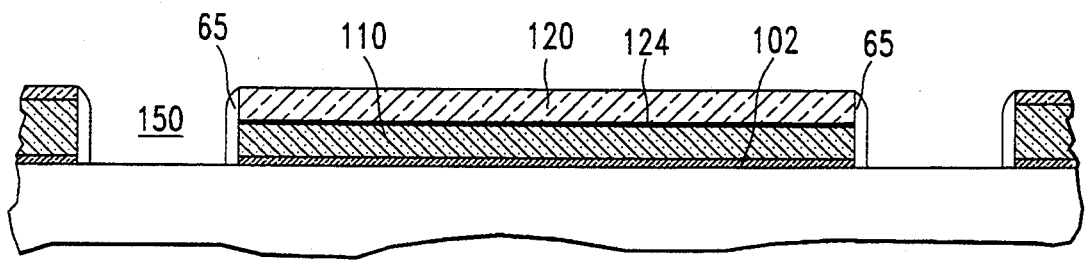
FIGS. 13A-13C illustrate an alternative embodiment of the invention.
Figure 13B:
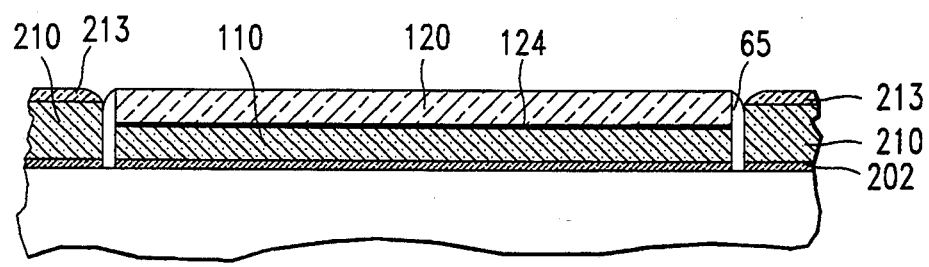
Figure 13C:
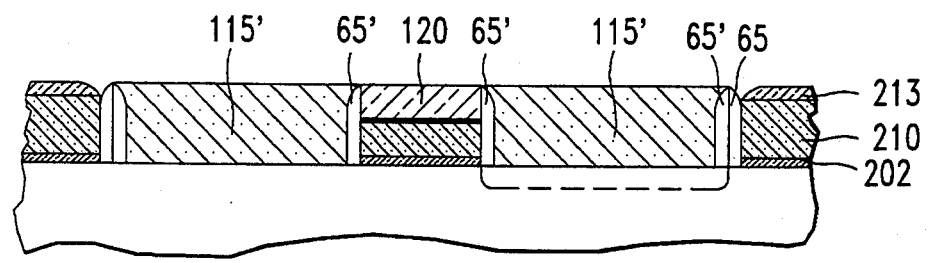

Referring now to FIG. 13, there is shown an alternative embodiment of the invention in which a field plate is used for improved isolation. In FIG. 13, the same gate stack has been deposited and patterned for apertures 150 as in FIG. 1. Sidewalls 65 have been deposited on the walls of aperture 150 as in FIG. 4. An oxide 202 has been either deposited or grown within apertures 150 after which poly field plate 210 has been deposited and oxide 213 has been deposited or grown over field plate 210. Field plate 210 will be connected to ground as is conventional. FIG. 13C shows the results of additional steps in which source and drain apertures have been formed and sidewalls 65' have been formed on the edge of the gate stack, together with the usual implantation of source and drain. The apertures have then been filled with poly contacts 115' that have been polished using oxide 213 and nitride 120 as a polish stop. This embodiment combines the lack of intrusion into the substrate characteristic of the previous embodiments with the advantages of a field plate.

Those skilled in the art will readily appreciate that the invention may be practiced in a variety of embodiments. For example, the illustrations have shown N-channel MOS field effect transistors (FETs), but the invention may be practiced with P-channel FETs or with bipolar or biCMOS technology as well. Similarly, a number of methods of transistor formation have been illustrated and those skilled in the art will readily be able to apply the invention to many other methods of transistor construction. The invention is not meant to be limited to the embodiments shown here, but only by the scope of the claims.

We claim:

1. A method of making an integrated circuit composed of a plurality of transistors comprising the steps of:
   preparing a single-crystal silicon substrate;
   depositing a gate stack of layers on said substrate comprising a gate oxide layer, a polysilicon gate layer above said gate oxide layer and a nitride cap layer above said gate layer;
   patterning said gate stack to etch isolation apertures about a plurality of transistor sites in said substrate;
   depositing a layer of isolation oxide in said isolation apertures, thereby forming a set of isolation members in isolation areas about said transistor sites;
   polishing said layer of isolation oxide until it is coplanar with said nitride cap layer at an isolation surface;
   etching source and drain apertures through said gate stack down to said substrate in a selective etch process that does not attack said isolation members;
   forming sources and drains in said source and drain apertures;
   depositing conductive source and drain contacts in said source and drain apertures and polishing said source and drain contacts until they are coplanar with said nitride cap layer and said oxide isolation members at said isolation surface;
   removing at least a portion of said nitride cap layer to expose said gate layer to form said plurality of transistors; and
   interconnecting said plurality of transistors to form said integrated circuit.

2. A method according to claim 1, further comprising a step of implanting an LDD dose of ions in said source and drain apertures and thereafter forming LDD sidewalls comprising the steps of depositing at least one conformal insulating layer on side walls of said source-drain apertures and removing said conformal layer from the bottom of said apertures, and thereafter implanting sources and drains, thereby forming a set of self-aligned source-drain contact apertures in which the source and drain contacts are insulated from said gate stack by said LDD sidewalls.

3. A method according to claim 2, further comprising the step of oxidizing said source and drain contacts using said nitride layer as an oxidization mask before said step of removing said nitride cap layer.

4. A method according to claim 2, further comprising the step of polishing said polysilicon gate layer using said isolation oxide as a polish stop.

5. A method according to claim 3, further comprising the step of polishing said polysilicon gate layer using said isolation oxide as a polish stop.

6. A method according to claim 1, further comprising the step of annealing said substrate after formation of said source-drain contacts and opening of said gate contact aperture.

7. A method according to claim 6, further comprising a step of implanting an LDD dose of ions in said source and drain apertures and thereafter forming LDD sidewalls comprising the steps of depositing at least one conformal insulating layer on side walls of said source-drain apertures and removing said conformal layer from the bottom of said apertures, and thereafter implanting sources and drains, thereby forming a set of self-aligned source-drain contact apertures in which the source and drain contacts are insulated from said gate stack by said LDD sidewalls.

8. A method according to claim 7, further comprising the step of oxidizing said source and drain contacts using said nitride layer as an oxidization mask before said step of removing said nitride cap layer.

9. A method according to claim 7, further comprising the step of polishing said polysilicon gate layer using said isolation oxide as a polish stop.

10. A method according to claim 8, further comprising the step of polishing said polysilicon gate layer using said isolation oxide as a polish stop.

11. A method according to claim 2, further comprising the step of depositing a conformal layer of dielectric having a contact dielectric thickness in said source-drain apertures after said step of forming said sidewalls, whereby said sources and drains are separated from said gates by said sidewalls and by said contact dielectric.

12. A method according to claim 11, further comprising the step of oxidizing said source and drain contacts using said nitride layer as an oxidization mask before said step of removing said nitride cap layer.

13. A method according to claim 12, further comprising the step of polishing said polysilicon gate layer using said isolation oxide as a polish stop.

14. A method according to claim 3 further comprising the step of removing said polysilicon gate layer and said nitride cap layer after said step of oxidizing said source and drain contacts to form a gate aperture between said source and drain contacts;
   implanting a channel dose of ions into said substrate through said gate aperture; and
   depositing a conductive gate element in said aperture.

15. A method according to claim 14, in which said gate oxide layer is removed and a second gate oxide layer is grown.

16. A method according to claim 14, in which said conductive gate element is formed from polycrystalline silicon.

17. A method according to claim 15, in which said conductive gate element is formed from polycrystalline silicon.

18. A method of making an integrated circuit composed of a plurality of transistors comprising the steps of:
- preparing a single-crystal silicon substrate;
- depositing a gate stack of layers on said substrate comprising a gate oxide layer, a polysilicon gate layer above said gate oxide layer and a nitride cap layer above said gate layer;
- patterning said gate stack to etch isolation apertures about a plurality of transistor sites in said substrate;
- depositing a layer of oxide in said isolation apertures, thereby forming a set of isolation members in said isolation apertures about said transistor sites;
- depositing a field plate layer of polysilicon above said layer of oxide in said isolation apertures and oxidizing the top surface of said field plate layer of polysilicon;
- polishing said oxidized field plate layer of polysilicon until it is coplanar with said nitride cap layer;
- depositing and patterning a layer of resist above said plurality of transistor sites to define a transistor gate in each transistor site;
- etching source and drain apertures through said gate stack down to said substrate in a selective etch process that does not attack said isolation members;
- forming sources and drains in said source and drain apertures, including a substep of forming insulating sidewalls on said source and drain apertures;
- depositing conductive source and drain contacts in said source and drain apertures and polishing said source and drain contacts until they are coplanar with said nitride cap layer and said oxide isolation layer;
- removing at least a portion of said nitride cap layer to expose said gate layer to form said plurality of transistors; and
- interconnecting said plurality of transistors to form said integrated circuit.

19. A method according to claim 18, further comprising the step of forming insulating sidewalls in said isolation apertures.

* * * * *